United States Patent [19]

Matsuo et al.

[11] Patent Number: 4,863,550

[45] Date of Patent: Sep. 5, 1989

[54] ALIGNMENT HOLE FORMING DEVICE FOR FILM LAMINATING APPARATUS

[75] Inventors: Takao Matsuo, Kobe; Norihasu Sawada, Hasuda, both of Japan

[73] Assignee: Somar Corporation, Japan

[21] Appl. No.: 203,067

[22] Filed: Jun. 7, 1988

Related U.S. Application Data

[62] Division of Ser. No. 27,230, Feb. 6, 1987, Pat. No. 4,759,809.

[30] Foreign Application Priority Data

| Jun. 7, 1985 | [JP] | Japan | 60-122640 |
| Oct. 26, 1985 | [JP] | Japan | 60-240235 |
| Oct. 26, 1985 | [JP] | Japan | 60-240236 |

[51] Int. Cl.$^4$ .................................... B32B 31/18
[52] U.S. Cl. ............................ 156/353; 83/364; 83/368; 156/355; 156/513; 156/556
[58] Field of Search ............. 156/64, 353, 355, 378, 156/517, 552, 556, 513; 83/71, 210, 364, 368, 240, 248

[56] References Cited

U.S. PATENT DOCUMENTS

| 3,547,730 | 12/1970 | Cohen et al. | 156/345 |
| 3,732,761 | 5/1973 | Sanders | 83/369 X |
| 3,881,379 | 5/1975 | Stumpf | 83/365 X |
| 4,025,380 | 5/1977 | Benardo | 156/355 |
| 4,205,769 | 6/1980 | Blitchington | 83/365 X |
| 4,214,936 | 7/1980 | Del Bianco | 156/351 X |
| 4,407,614 | 10/1983 | Muhr et al. | 83/368 X |
| 4,585,509 | 4/1986 | Obayashi | 156/517 X |
| 4,659,419 | 4/1987 | Miyake | 156/522 |
| 4,680,079 | 7/1987 | Tanaka | 156/353 |
| 4,728,386 | 3/1988 | Horvath | 156/522 X |

FOREIGN PATENT DOCUMENTS 37-6292 6/1962 Japan.
51-26675 8/1976 Japan.

*Primary Examiner*—David Simmons
*Assistant Examiner*—David W. Herb
*Attorney, Agent, or Firm*—Stephen F. K. Yee

[57] ABSTRACT

In a laminating apparatus wherein a predetermined length of a film cut from a continuous web is laminated onto a substrate having positioning holes, a method for forming alignment or indexing holes in the film which correspond with the positioning holes in the substrate includes detecting the position of the positioning holes, establishing the location on the film where the alignment holes are to be formed, and punching the holes in the film. The apparatus includes a hole-forming device positioned to move along the film transfer path, the operation of the device being regulated by a sensor for detecting the position of the positioning holes, a control device for setting the position of the hole-forming device relative to the film in response to the sensor signal, and a mechanism for displacing the hole-forming device to the proper location for forming the alignment holes.

5 Claims, 4 Drawing Sheets

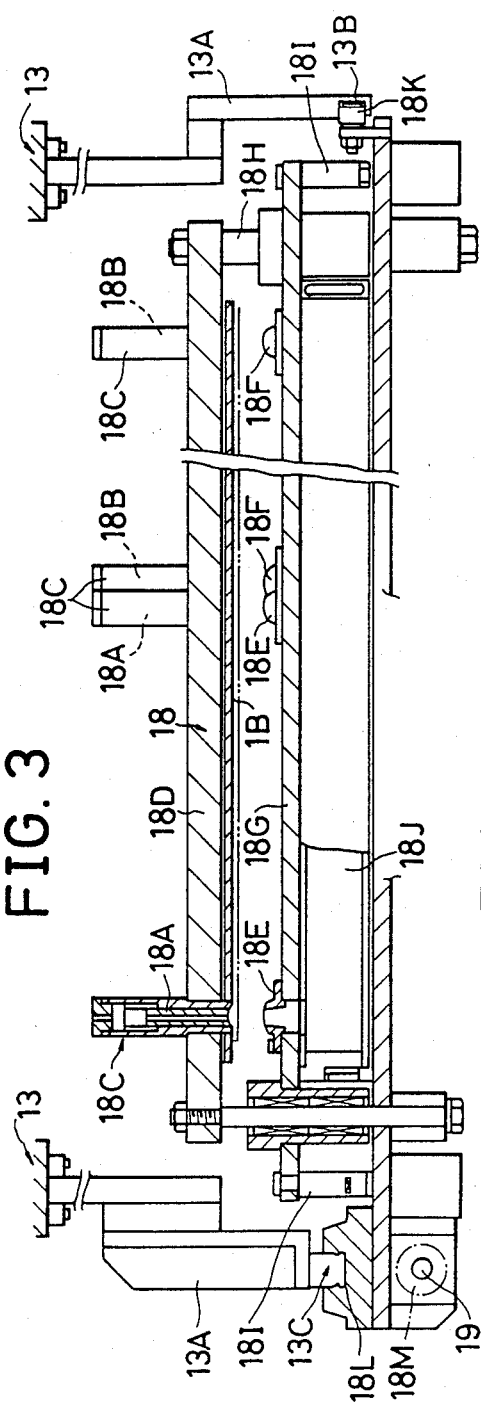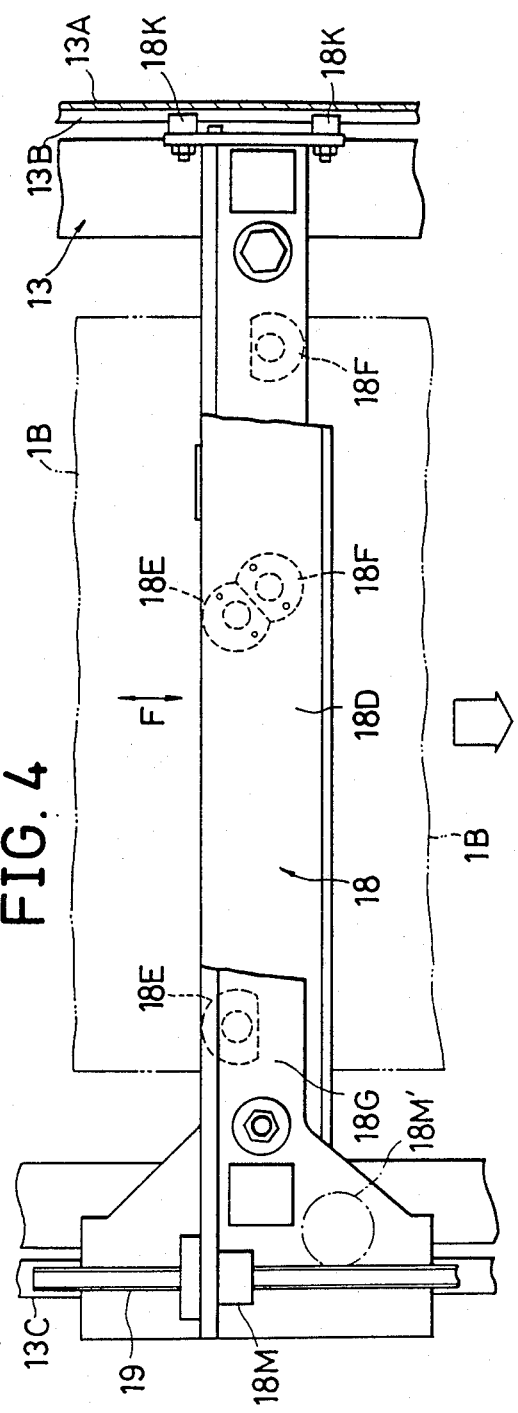

ALIGNMENT HOLE FORMING DEVICE FOR FILM LAMINATING APPARATUS

This application is a division of application Ser. No. 027,230, filed Feb. 6, 1987, now U.S. Pat. No. 4,759,809.

TECHNICAL FIELD

The present invention relates to a punching device and, more particularly, to a technique effective for an application to a film punching device for use with a film laminating apparatus.

BACKGROUND ART

Printed-wiring boards to be used to electronic equipments such as computers are those prepared by forming a determined pattern of wiring of copper or the like on one or both sides of an insulating substrate.

Printed-wiring boards of this kind may be prepared by the following manufacturing steps.

First, a laminate consisting of a photosensitive resin (photoresist) layer and a translucent resin film (protective layer) protecting the photosensitive resin layer is laminated by thermocompression bonding on a conductive layer mounted on an insulating substrate. The lamination by thermocompression bonding may be conducted on a large scale using a film laminating apparatus or a so-called laminater. Thereafter, a wiring pattern film is placed on the laminate, and the photosensitive resin layer is exposed for a determined period of time through the wiring pattern film and the translucent resin film. After the translucent resin film is peeled off using a peeling device, the exposed photosensitive resin layer is developed to form an etching mask pattern. Thereafter, unnecessary portions of the conductive layer are removed by means of etching and further the remaining photosensitive resin layer is removed, thereby leading to a printed-wiring board with a predetermined wiring pattern.

In the manufacturing steps of the printed-wiring boards as described above, it is necessary to use the step of exposing the photosensitive resin layer by superposing the wiring pattern film on the laminate laminated on the substrate by thermocompression bonding. This superposition is carried out by fitting a positioning pin in a guide hole (positioning hole) formed at a corner or end portion of the substrate and a guide hole (positioning hole) formed on the wiring pattern film so as to correspond to the above guide hole. Since the laminate is laminated on the substrate, a hole for fitting the positioning pin is formed on the laminate at the position corresponding to the guide hole on the substrate prior to the fitting of the positioning pin. The punching on the laminate may be conducted manually using a drill or a punch or mechanically using a punching device for exclusive use after the laminate has been laminated on the substrate by thermocompression bonding.

However, manual or mechanical punching of the laminate causes problems, resulting in extremely poor work efficiency.

In forming a hole on the laminate, chips of the laminate are scattered on the laminate on which a wiring pattern is formed and it is extremely hard to clear such chips. This prevents the wiring pattern from being drawn accurately on the photo-sensitive resin layer resulting in a decrease in a yield in the manufacture of printed-wiring boards.

DISCLOSURE OF THE INVENTION

The object of the present invention is to provide a method and a device of punching a film for use with a film laminating apparatus capable of improving work efficiency.

Other objects of the present invention are to provide a method and a device of punching a film for use with a film laminating apparatus capable of improving manufacturing yield, in addition to achieving the above object.

The present invention is characterized in that, in the film punching method for use with a film laminating apparatus for laminating a film cut to a determined length on the substrate with positioning holes, the method is provided with the step of detecting the positions of the positioning holes on the substrate transferred to the film laminating apparatus, the step of setting punching positions on the film to be laminated on the substrate with the film laminating apparatus corresponding to the positions of the positioning holes on the substrate, and the step of puching the film at the punching positions thereof. The present invention is also characterized in that, in the film punching device for use with the film laminating apparatus for laminating a film cut to a determined length on the substrate with positioning holes, a punching device for forming holes on the film to be laminated on the substrate is disposed on a film transferring passage of the film laminating apparatus, a substrate dimension detecting sensor for detecting the positions of the positioning holes on the substrate is disposed in a substrate transfer passage for conveying the substrate to the film laminating apparatus, a control device for setting the punching positions on the film on the basis of the signal detected by the substrate dimension detecting sensor is provided, a displacing mechanism for displacing the punching device to the punching position of the film on the basis of an output from the control device is provided at a determined position, and a punch starting sensor for forming holes on the film by way of the punching device set at the punching position of the film is provided on the substrate transfer passage. With these arrangements, the present invention can improve work efficiency because holes can be formed automatically by punching at the punching positions on the film corresponding to the positions of the positioning holes on the substrate prior to or during the lamination of the film. The present invention also can improve the manufacturing yield because holes are formed at the punching positions on the film prior to the lamination of the film on the substrate, thereby enabling chips of the film to be removed at this movement.

The present invention is further characterized in that, in the film punching device for use with the film laminating apparatus for laminating the film cut to a determined length on the substrate with positioning holes, a defect detecting sensor for detecting whether the holes are formed at the determined positions on the film corresponding to the positions of the positioning holes is disposed on the substrate transfer passage for conveying the substrate laminated with the film on which the holes are formed at positions corresponding to the positions of the positioning holes. With this arrangement, the present invention can improve work efficiency because the defect detecting sensor can automatically detect nondefective and defective substrates.

BRIEF DESCRIPTION OF THE DRAWINGS

FIG. 3 is a sectional view illustrating a punching device, taken in the direction of the arrow D in FIG. 2.

FIG. 4 is a side view illustrating a punching device, taken in in the direction of the arrow F in FIG. 2.

BEST MODE FOR CARRYING OUT THE INVENTION

Figure 1:
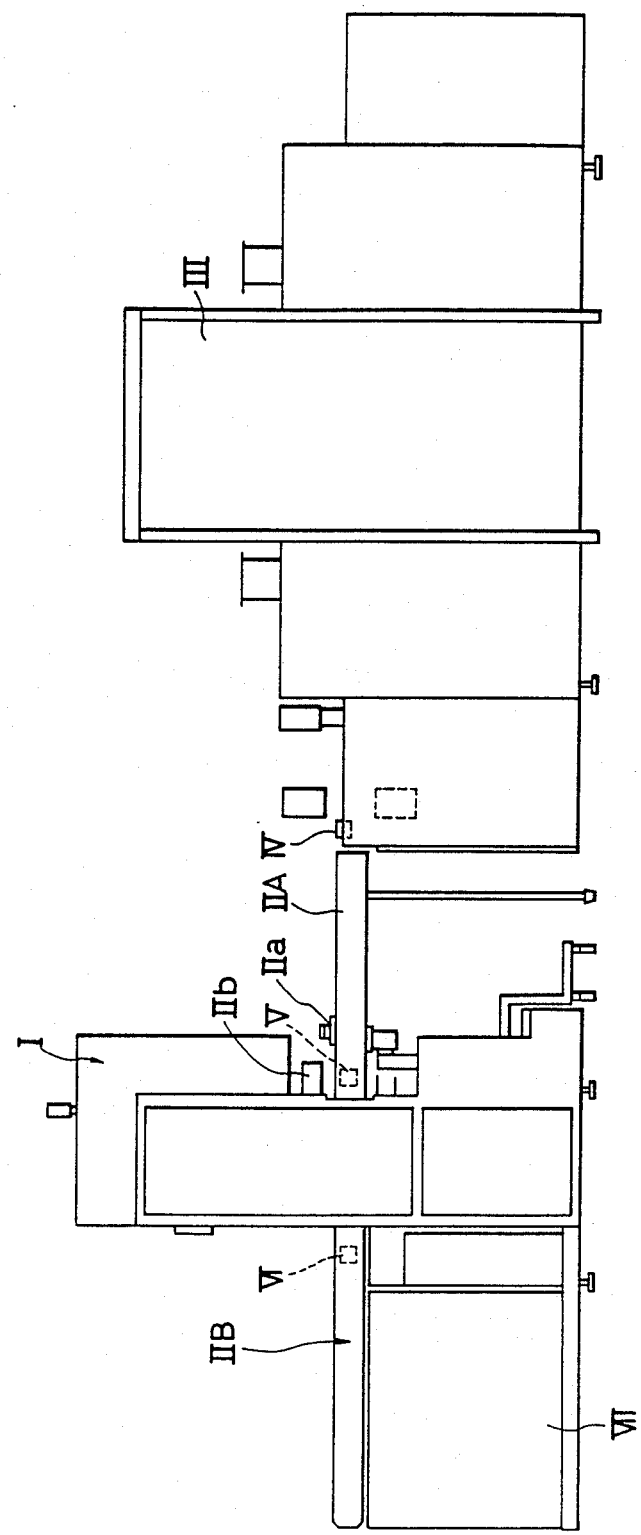
FIG. 1 is a schematic diagrammatical view illustrating an embodiment of a film lamination system according to the present invention.

The following is a description on an embodiment with reference to the drawings, in which the present invention is applied to a punching device for use with a film laminating apparatus (laminator) for laminating by thermocompression bonding a laminate with a photosensitive resin layer on a substrate for printed-wiring boards (a board with a conductive layer formed on an insulating board).

It is to be understood that, in all the drawings of the embodiments, what has identical functions is represented by identical reference numerals and duplicate description thereon will be omitted.

FIG. 1 shows a film lamination system construction that is an embodiment according to the present invention.

As shown in FIG. 1, the film lamination system according to this embodiment is composed of a film laminating apparatus I, a conveying apparatus IIA, a conveying apparatus IIB and a pre-heating apparatus III.

The pre-heating apparatus III is disposed at the front side of a substrate transfer passage for transferring substrates to the film laminating apparatus I. The pre-heating apparatus III is designed so as to pre-heat the insulating substrate (a substrate for a printed-wiring board; hereinafter referred to merely as "substrate") with the conductive layer formed on one (or both) side thereof prior to the lamination by thermocompression bonding. The pre-heating is effected in order to facilitate the lamination of the laminate with the photo-sensitive resin layer on the substrate by thermocompression bonding.

The conveying apparatus IIA is designed so as to transfer the substrates pre-heated by the pre-heaing apparatus III to the film laminating apparatus I. The conveying apparatus IIA is provided with a substrate widthwise shifting apparatus IIa for coinciding the center line of the substrate in the substrate transfer direction with the center line of the film laminating apparatus I (laminator) so as to permit an accurate lamination by thermocompression bonding. The substrate widthwise shifting apparatus IIa is equipped with a control mechanism so as not to cause warps and so on in a widthwise direction (a direction perpendicular to the direction of transferring the substrates) even on a thin film.

The conveying apparatus IIA (or the film laminating apparatus I) is also equipped with a pressing device IIb for fixing the substrate so as not to move during the lamination by thermocompression bonding.

The conveying apparatus IIB is constructed so as to convey to an exposing device the substrates with the laminate laminated by thermocomprescompression bonding with the film laminating apparatus I.

The film lamination system is provided with a substrate dimension detecting sensor IV on the substrate transfer passage for transferring substrates to the film laminating apparatus I, more specifically, at the discharge side of the substrate transfer passage for the pre-heating apparatus III. The substrate dimension detecting sensor IV is constructed, as will be described more in detail, so as to detect positions of the front end and the rear end in the transfer direction of the substrate being carried at a constant speed by conveyor rollers and output the detected signals to a control device VII. The control device VII is mounted on the lower portion of the conveying apparatus IIB. The substrate dimension detecting sensor IV may be mounted in the substrate transfer passage at the front side of the conveying apparatus IIA.

The film lamination system is also provided with a substrate position detecting sensor (a punch starting sensor) V on the substrate transfer passage along which the substrates are conveyed to the film laminating apparatus 1, more specifically, on the substrate transfer passage at the rear side of the conveying apparatus IIA. The substrate position detecting sensor V is designed so as to detect the positions of the front end and the rear end in the transfer direction of the substrate being carried at a constant speed by conveyor rollers and output the detected signals to the control device VII.

The film lamination system is further provided with a defective punched hole detecting sensor VI on the substrate transfer passage along which the substrates are transferred from the film laminating apparatus I to the exposing apparatus, more specifically, on the substrate transfer passage at the front side of the conveying apparatus IIB. The defective punched pole detecting sensor VI is designed so as to detect whether holes are punched at the punching positions on the laminate corresponding to a substrate dimension (actually, positions of the guide holes or the positioning holes to be set by means of a dimension of the substrate) subsequent to the lamination by thermocompression bonding and output the detected signals to the control device VII.

The substrate dimension detecting sensor IV, the substrate position detecting sensor V or the defective punched hole detecting sensor VI may be constructed, for example, by a transmission type photosensor, a reflection type photosensor or a supersonic sensor.

Figure 2:
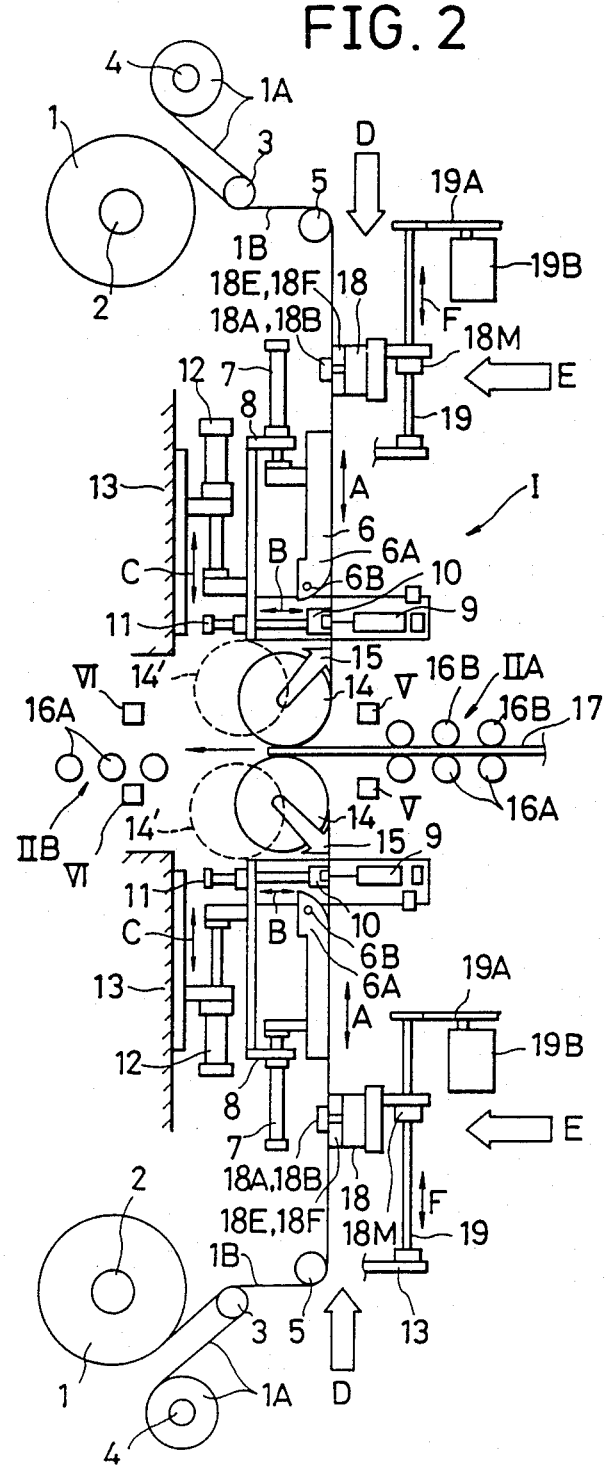
FIG. 2 is a schematic diagrammatical view illustrating a film laminating apparatus of the film lamination system.

The film laminating apparatus I is constructed as illustrated in FIG. 2 (a schematic diagrammatical view). The laminate 1 has a three-layer construction consisting of the translucent resin film, the photosensitive resin layer and the translucent resin film and is wound continuously on a feed roller 2. The laminate 1 on the feed roller 2 is caused to be peeled off by a peeling roller 3 into the translucent resin film (a protective film) 1A and a laminate 1B having the photosensitive resin layer with one side (an adhesive side) exposed and the translucent resin film.

The separated translucent resin film 1A is arranged to be wound by a take-up roller 4.

The front end portion in the feed direction of the laminate 1B is constructed so as to be stuck by suction on a main vacuum plate 6 through a tension roller 5 giving an appropriate tension.

The main vacuum plate 6 is supported on a frame 8 by way of an air cylinder 7 designed to move the vacuum plate in the direction of the arrow A. The main vacuum plate 6 is constructed, in association with the tension roller 5, so as to feed the laminate 1B toward the side of a substrate 17 in a manner causing no warps and so on.

The main vacuum plate 6 is embedded with a heater 6B in an arc portion 6A at the front end thereof such that the front end portion of the laminate 1B is laminated temporarily on the conductive layer of the substrate 17 by thermocompression bonding.

At the position adjacent to the arc portion 6A is mounted a rotary cutter 9 for cutting the continuous laminate 1B in accordance with a dimension of the substrate 17.

At the position facing the rotary cutter 9 is mounted a second vacuum plate 10 for causing the front end portion of the cut laminate 1B to be stuck on the arc portion 6A. The second vacuum plate 10 is supported on the frame 8 by way of an air cylinder 11 designed to move the vacuum plate in the direction of the arrow B.

The frame 8 supporting the main vacuum plate 6 and the second vacuum plate 10 is in turn supported on a frame 13 of the main body of the film laminating apparatus I via an air cylinder 12 designed to move the frame in the direction of the arrow C.

The laminate 1B whose front end portion was caused to temporarily laminate on the conductive layer of the substrate 17 by thermocompression bonding at the arc portion 6A is arranged such that the whole area thereof is laminated by thermocompression bonding with a thermocompressively bonding roller 14. The thermocompressively bonding roller 14 is constructed so as to be displaced from the position indicated by the dotted lines with reference numeral 14' to the position indicated by the solid line, as shown in FIG. 2, after the front end portion of the laminate 1B has been laminated temporarily by thermocompression bonding at the arc portion 6A.

The rear end portion of the laminate 1B cut with the rotary cutter 9 is arranged so as to be guided by a rotary vacuum plate 15 in a manner causing no wrinkles and so on and laminated by thermocompression bonding with the thermocompressively bonding roller 14.

The film laminating apparatus I constructed as described above laminates the laminate 1B by thermocompression bonding on both sides (or one side) of the conductive layer of the substrate 17 being transferred by the conveying apparatus IIA consisting of conveyor rollers 16A, pressure rollers 16B and so on in accordance with each of the constructions as described above. The lamination by thermocompression bonding is effected in such a manner that the positions of the guide holes (or the positioning holes) formed on the substrate 17 coincide with the positions of punched holes (guide holes or positioning holes) formed on the laminate 1B with a punching device 18. The laminate 1B is constructed so as to be laminated by thermocompression bonding on the substrate 17 in such a manner as causing an adhesive surface of the photosensitive resin layer with the translucent resin film 1A peeled of to adhere to a surface of the conductive layer.

The punching device 18 is constructed as illustrated in FIGS. 2, 3 (a cross sectional view taken in the direction of the arrow D in FIG. 2), and 4 (a side view taken in the direction of the arrow E in FIG. 2). The punching device 18 is constructed such that the laminate 1B is punched by means of an engagement of convex cutters (punches) 18A and 18B supported via a holder 18C by a cutter supporting member 18D with concave cutters (dice) 18E and 18F supported by a cutter supporting member 18G. The cutter supporting member 18G is constructed so as to be movable against the cutter supporting member 18D by way of a supporting shaft 18H and a driving device (an air or hydraulic cylinder) 18I and cause the cutters 18A and 18B to be engaged with the cutters 18E and 18F, respectively.

The cutters 18A and 18E are constructed to punch the front end portion of the laminate 1B to be laminated on the substrate 17 by thermocompression bonding, and the cutters 18B and 18E are constructed to puch the rear end portion of the laminate 1B. The laminate 1B with holes formed by punching is caused to be cut between the punched hole at the front end portion and the punched hole at the rear end portion with the rotary cutter 9. This arrangement of the cutters 18A, 18B and 18E, 18F allows the punching device 18 to be constructed in a dimension extremely smaller than the dimension of the substrate 17 (a dimension in the transfer direction), thereby miniaturizing the punching device 18.

The cutters 18A and 18B are constructed so as to be slidable within the holder 18C by means of compressed air pressure. The cutters 18A and 18B are provided with a through hole in the axial direction in which compressed air blows. The compressed air blowing from the hole causes chips produced during the punching on the laminate 1B to be collected in a cleaner box 18J through the through holes of the cutters 18E and 18F. The chips collected in the cleaner box 18J may be removed manually in a determined cycle or automatically into another container by suction. The dimensional sizes of the cutters 18A, 18B and 18E, 18F are constructed to be larger than the sizes of the guide holes for the substrate 17 in order to ensure a margin for the positioning of the two.

By collecting the chips produced when the laminate 1B is punched automatically in the cleaner box 18J at this moment, the chips can be prevented from scattering between the photosensitive resin layer and the wiring pattern film in the exposing step so that a wiring pattern can be drawn accurately on the photosensitive resin layer and the yield of manufacturing printed-wiring boards attributable to the chips is improved.

The punching device 18 is supported through an arm 13A on the frame 13 on the feeding passage (transfer passage) of the laminate 1B in a manner movable in the direction of the arrow F (in the up-and-down direction). That is, the punching device 18 is constructed such that a roller 18K at one end portion is slidably movable along a guide groove 13B of the arm 13A and a guide groove 18L at the other end portion allows a guide rail 13C of the arm 13A to be moved slidably. The movement of the punching device 18 is controlled by causing a screw ball nut 18M (or a gear 18M') mounted at the other end portion to be in mesh with a screw shaft (screw axis) 19 mounted rotatively on the frame 13. The screw shaft 19 is connected through a transmitting mechanism (gear mechanism) 19A to a control motor 19B. The control motor 19B is constructed so as to displace the punching device 18 to the punching position of the laminate 1B corresponding to the position of punching the guide hole on the substrate 17 on the basis of an output signal from the control apparatus VII in response to a signal detected by the substrate dimension detecting sensor input into the control apparatus VII.

The laminate 1B with a hole formed by punching with the punching device 18 is laminated on the substrate 17 by thermocompression bonding in a manner such that the punched hole of the laminate 1B coincides with the guide hole of the substrate 17, and the substrate 17 is carried over to the conveying apparatus IIB. The apparatus is constructed so that the substrate 17 carried over is then subjected to a detection by the punch defect detecting sensor VI to check whether the positions of the holes punched on the laminate 1B coincide with the positions of the guide holes punched on the substrate 17 (FIGS. 1 and 2). It is also noted that the punch defect detecting sensor VI is constructed to permit a detection of a defect in which a laminate 1B with no hole formed by punching is laminated on the substrate 17.

When it is found as a result of detection by the punch defect detecting sensor VI that the substrate 17 has no defects, the substrate 17 is then transferred with the conveying apparatus IIB to the exposing apparatus. In the event that the substrate 17 is found to be defective as a result of detection by the punch defect detecting sensor VI, an operator is so informed by way of an alarm. It may be possible to mount on the conveying apparatus IIB a defective substrate discharging apparatus for discharging a defective substrate 17 from the conveying passage by way of a discharging member. The defective substrate 17 may be thrown away or subjected to an adjustment of the punched position of the laminate 1B manually or by another punching device and then transferred again to the exposing apparatus by the conveying apparatus IIB.

By mounting the punch defect detecting sensor on the substrate transfer passage between the film laminating apparatus I and the exposing apparatus as described above, the defective substrate 17 is prevented from being transferred to the apparatus at the next stage, thereby improving the yield of manufacturing printed-wiring boards. As the defective substrate 17 is automatically detected, work efficiency can also be improved.

Figure 5:
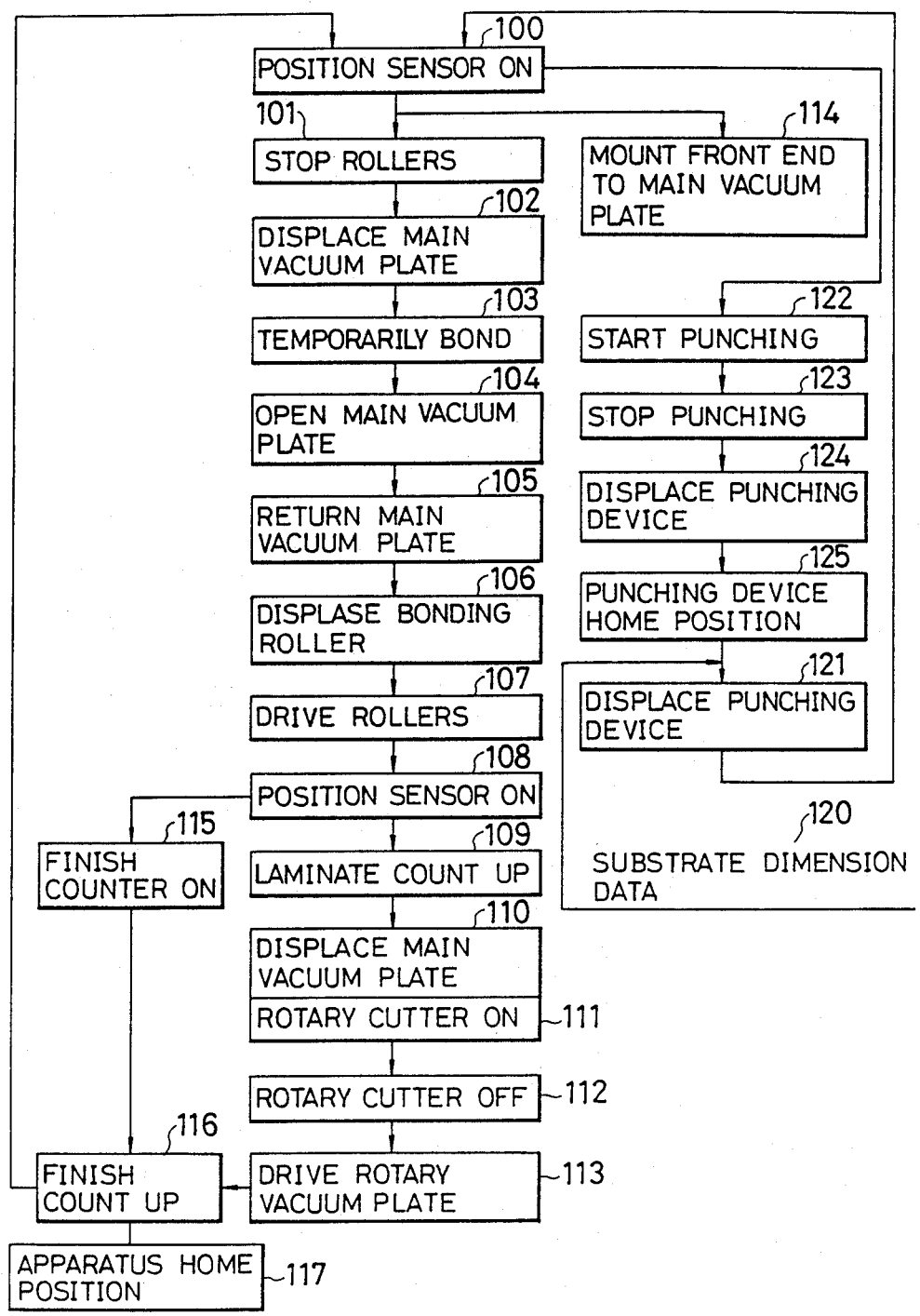
FIG. 5 is a flow chart illustrating a control method of the film laminating apparatus and the punching device.

The following is a description on a method of controlling the film laminating apparatus I and the punching device 18 with reference to FIGS. 1 to 4 and to a control flow chart as shown in FIG. 5.

The substrate 17 pre-heated by the pre-heating apparatus III indicated in FIG. 1 is first measured for its dimension (a length in the transfer direction in this embodiment) during travel using the substrate dimension detecting sensor IV. The substrate dimension detecting sensor IV detects the front end and the rear end in the transfer direction of the substrate 17 and outputs the detected signal to the control apparatus VII.

In the control apparatus VII, the corresponding dimension of various substrates 17 is output as a pulse signal by multiplying a constant transfer speed S of the substrate 17 with a time T during which the substrate 17 passes through the substrate dimension detecting sensor IV (substrate dimension=S×T), the dimensions are classified by pulse numbers for dimensions, converted into data (hereinafter referred to as substrate dimension data) and stored in a memory apparatus <120>.

The transfer speed S of the substrate 17 may be obtained by setting the rotation speed of the conveyor rollers 16A at a constant rate.

The time T through which the substrate 17 passes through the substrate dimension detecting sensor IV may be obtained from the signals for the front end and the rear end of the substrate 17 detected by the substrate dimension detecting sensor IV. For example, if it is constructed such that, when the front end of the substrate 17 is detected by the substrate dimension detecting sensor IV, a counter starts counting pulses (clock) of a constant frequency and, when the rear end thereof is detected, it stops counting and a signal corresponding to the count number counted by the counter is generated, the procedure will be rendered simple.

Various kinds of substrates 17 are classified into determined dimensional ranges, for example, $D_1$, $D_2$, $D_3$, $D_4$ and $D_5$, as substrate dimension data, by pulse numbers corresponding to the detected dimensions of the substrates 17.

In causing the substrate dimension data of $D_1$ to $D_5$ to be stored in the memory apparatus, if no substrate dimension data exists in an input address, the address is designed to be shifted in the order up to the address where the substrate dimension data exist. And it is designed such that the substrate dimension data in the forefront address is always read out. The substrate dimension data in the forefront address is arranged so as to become a punching position data corresponding always to the dimension of a substrate.

The control apparatus VII drives the control motor 19B on the basis of the substrate dimension data to displace the punching device 18 by way of the transmitting mechanism 19A and the screw shaft 19 <121>. The punching device 18 is displaced so as to coincide the positions of the guiding holes (or the positioning poles) punched on the substrate 17 to be set by the substrate dimension data with the holes (guiding punched holes or positioning holes) punched on the laminate 1B laminated by thermocompression bonding on the substrate 17.

In this state, when the substrate position detecting sensor V detects the front end of the substrate 17 <100>, the punching device 18 is driven <122> and holes are punched at the punching positions on the laminate 1B <123>. When punched holes are formed by punching, a a final signal is input to the control apparatus VII <124>. Based on this signal, the punching device 18 is displaced by way of the control apparatus VII and the punching device 18 is returned to a base position <125>. As the punching device 18 is returned to the base position, a finish signal is input to the control apparatus VII and the substrate dimension data that operated the punching device 18 is deleted from the forefront address of the memory circuit. To the deleted address of the memory circuit is shifted from the next address a substrate dimension data of a substrate 17 that is being carried next.

On the other hand, the signal detected by the substrate position detecting sensor V stops the conveyor rollers 16A of the transferring apparatus IIA <101> and the substrate 17.

At this moment, the front end portion of the laminate 1B is stuck on the arc portion 6A of the main vacuum plate 6 in the film laminating apparatus I <114>. The adsorption of the front end portion of the laminate 1B is carried out using the second vacuum plate 10. The front end portion of the laminate 1B has a punched hole or holes formed in a step identical to the step of punching the rear end portion of the laminate 1B laminated by thermocompression bonding on the substrate 17 in the previous step by cutters 18A and 18E.

In the state where the laminate 1B is stuck on the arc portion 6A, the main vacuum plate 6 is moved to the side of the substrate 17 <102> and the front end portion of the laminate 1B is laminated temporarily by thermocompression bonding on the front end portion of the substrate 17 <103>.

As the lamination by thermocompression bonding is finished, the main vacuum plate 6 is stopped <104> and the main vacuum plate 6 is shifted to the original base position <105>.

The thermocompressively bonding roller 14 is then displaced from the position indicated by the dotted lines with reference numberal 14' to the position indicated by the solid line in FIG. 2 <106>. When the substrate 17 is clamped by means of the movement of the thermocompressively bonding roller 14, the thermocompressively bonding roller 14 and the conveyor rollers 16A are driven <107>, thereby starting the lamination of the laminate 1B by thermocompression bonding on the substrate 17 from the front end portion where temporarily bonded thermocompressively.

As the rear end portion of the substrate 17 being laminated by thermocompression bonding is detected by the substrate position detecting sensor V <108>, the control apparatus VII counts a time or a distance up to the position for cutting the laminate 1B on the basis of the detected signal <109>. As the count reaches a determined value, the main vacuum plate 6 is displaced at a speed higher than that of lamination by thermocompression bonding <110> and sets the rear end portion of the laminate 1B at the cutting position for the rotary cutter 9.

The rear end portion of the laminate 1B set at the cutting position is cut by the rotary cutter 9 <111>, <112>. The cut rear end portion of the laminate 1B is stuck on the rotary vacuum plate 15 and carried over to the substrate 17 in such a manner causing no wrinkles, and so on <113>, thereby finishing the lamination by thermocompression bonding.

When the rear end portion of the substrate 17 is detected by the substrate position detecting sensor V <108>, the counter for counting the number of substrates 17 laminated by thermocompression bonding starts operating <115> and, when the lamination by thermocompression bonding is finished, the number of the substrates 17 is counted <116>.

In instances where no new substrate 17 is transferred to the film laminating apparatus I, each apparatus and device of the film laminating apparatus I is displaced to the base position <117>. In instances where new substrates 17 are fed thereto in a continuous manner, the film laminating apparatus I and the punching device 18 are controlled again from the first stage of the above-described sequence control.

Thus, a time required for forming holes by punching can be shortened and work efficiency can be improved because the punched holes can be formed automatically at the punching positions on the laminate 1B corresponding to the positions for the guiding holes punched on the substrate 17 prior to or during the lamination of the laminate 1B by detecting a dimension of the substrate 17 being transferred to the film laminating apparatus I, setting the positions for the guiding holes punched on the substrate 17 according to the detection, setting the punching positions of the laminate 1B to be laminated on the substrate 17 with the film laminating apparatus I, and forming holes by punching at the punching positions of the laminate 1B.

Furthermore, each of substrates 17 being transferred at random intervals or continuously can be laminated accurately by thermocompression bonding with a laminate 1B with holes formed by punching because substrate dimension data set by signals detected by the substrate dimension detecting sensor IV are once stored in the order in a memory circuit, the substrate dimension data are read in order by signals detected by the substrate position detecting sensor V and holes are formed by punching the laminate 1B corresponding to each substrate 17.

It is to be understood as a matter of course that the present invention is not restricted to the above embodiments and may be varied in various manner within the scope without departing from the gist of the present invention.

For example, the present invention may be constructed such that a substrate dimension detecting sensor for detecting a dimension in the widthwise direction of the substrate 17 is mounted, a punching device designed so as for a punching position to be displaced in the widthwise direction of the laminate 1B is mounted, and the punching position of the punching device is controlled on the basis of a signal detected by the substrate dimension detecting sensor.

In the above embodiments, a substrate 17 having a guiding hole punched as a through hole is used. The present invention, however, may use a substrate 17 with guiding holes formed as lock holes. In this case, the guiding hole for a wiring pattern film are composed of through holes or lock holes.

The present invention may also be constructed such that the guiding holes for the substrate 17 being transferred to the film laminating apparatus I are directly detected, punching positions for the laminate 1B to be laminated on the substrate 17 by the film laminating apparatus I are set corresponding to the guiding holes for the substrate 17, and holes are formed by puching the laminate 1B at the punching positions.

The present invention may further be composed of a film laminating apparatus mounted with a punching device for forming holes by punching the laminate 1B using a laser beam.

We claim:

1. In combination with a laminator for laminating a film onto a substrate and having substrate feed means for providing a substrate along a substrate transfer path, the substrate having positioning holes to assist in aligning the film thereon, film feeding means for providing the film from a continuously web along a film transfer path, bonding means to bond the film onto the substrate, cutting means positioned along the film transfer path for cutting the film to a length corresponding to the length of the substrate, and means to remove the laminated substrate from the bonding means, a punching apparatus for forming alignment holes in the film to correspond with the positioning holes in the substrate when the film is bonded onto the substrate, the punching apparatus comprising:

a punching device provided adjacent to and controllably movable from a base position along the film transfer path to form said alignment holes in said film;

a substrate dimension sensor means positioned along the substrate transfer path to determine the length of each substrate and to determine the location of the positioning holes from said length and the speed that the substrate is moved along the substrate transfer path;

a control apparatus for setting the hole-forming positions of the film according to information provided by said substrate dimension sensor means;

a displacing mechanism for moving the punching device to the hole-forming positions in response to output control signals from said control apparatus; and a punch starting sensor means provided adjacent to said substrate transfer path for controlling operation of said punching device upon detection of the leading edge of the substrate.

2. A combination as set forth in claim 1, further comprising a defect detecting sensor means provided along the substrate transfer path for detecting if said alignment holes are formed in said film at the predetermined positions corresponding to said positioning holes in said substrate.

3. A combination as set forth in claim 2, wherein said defect detecting sensor is located along said substrate transfer path where said film has been bonded on said substrate, and operates to detect coincidence of the film alignment holes and the substrate positioning holes.

4. The combination as set forth in claim 2, wherein said punching device comprises convex and concave cutter members.

5. The combination as set forth in claim 2, wherein said substrate dimension sensor determines the time required for passage of the substrate pass a predetermined position by sensing passage of the leading and trailing edges of said substrate pass said predetermined position along the substrate transfer path, and determining the locations of said substrate positioning holes from the time and the speed of substrate movement.

* * * * *